(12) United States Patent
Li et al.

(10) Patent No.: US 9,631,272 B2
(45) Date of Patent: Apr. 25, 2017

(54) ATOMIC LAYER DEPOSITION OF METAL CARBIDE FILMS USING ALUMINUM HYDROCARBON COMPOUNDS

(71) Applicant: ASM America, Inc., Phoenix, AZ (US)

(72) Inventors: Dong Li, Phoenix, AZ (US); Steven Marcus, Tempe, AZ (US); Suvi P. Haukka, Helsinki (FI); Wei-Min Li, Espoo (FI)

(73) Assignee: ASM AMERICA, INC., Phoenix, AZ (US)

( * ) Notice: Subject to any disclaimer, the term of this patent is extended or adjusted under 35 U.S.C. 154(b) by 383 days.

(21) Appl. No.: 14/069,681

(22) Filed: Nov. 1, 2013

(65) Prior Publication Data

US 2014/0127405 A1 May 8, 2014

Related U.S. Application Data

(63) Continuation of application No. 12/424,470, filed on Apr. 15, 2009, now abandoned.

(Continued)

(51) Int. Cl.
*C23C 16/00* (2006.01)
*C23C 16/32* (2006.01)
(Continued)

(52) U.S. Cl.
CPC ........ *C23C 16/32* (2013.01); *C23C 16/45527* (2013.01); *H01L 21/28088* (2013.01);
(Continued)

(58) Field of Classification Search
CPC ............. C23C 16/32; C23C 16/45527; H01L 21/28273; H01L 21/28088; H01L 21/76843; H01L 21/28562; H01L 29/4966
(Continued)

(56) References Cited

U.S. PATENT DOCUMENTS 3,708,728 A 1/1973 Sterling et al.
4,058,430 A 11/1977 Suntola et al.
(Continued)

FOREIGN PATENT DOCUMENTS

EP 0 387 403 9/1990
EP 0 394 054 10/1990
(Continued)

OTHER PUBLICATIONS

Alen et al, "Atomic Layer Deposition of Ta(Al)N(C) Thin Films Using Trimethylaluminum as a Reducing Agent", Journal of the Electrochemical Society, 148 (10) G566-G571, 2001.*

(Continued)

*Primary Examiner* — Michael Wieczorek
*Assistant Examiner* — Michael G Miller
(74) *Attorney, Agent, or Firm* — Knobbe, Martens, Olson & Bear LLP

(57) ABSTRACT

Methods of forming metal carbide films are provided. In some embodiments, a substrate is exposed to alternating pulses of a transition metal species and an aluminum hydrocarbon compound, such as TMA, DMAH, or TEA. The aluminum hydrocarbon compound is selected to achieve the desired properties of the metal carbide film, such as aluminum concentration, resistivity, adhesion and oxidation resistance. In some embodiments, the methods are used to form a metal carbide layer that determines the work function of a control gate in a flash memory.

13 Claims, 3 Drawing Sheets

Related U.S. Application Data

(60) Provisional application No. 61/045,554, filed on Apr. 16, 2008.

(51) Int. Cl.
*C23C 16/455* (2006.01)
*H01L 21/28* (2006.01)
*H01L 29/49* (2006.01)
H01L 21/285 (2006.01)
H01L 21/768 (2006.01)

(52) U.S. Cl.
CPC .... *H01L 21/28273* (2013.01); *H01L 29/4966* (2013.01); *H01L 21/28562* (2013.01); *H01L 21/76843* (2013.01)

(58) Field of Classification Search
USPC .......................................... 427/248.1–255.7
See application file for complete search history.

(56) References Cited

U.S. PATENT DOCUMENTS

| | | |
|---|---|---|
| 4,085,430 A | 4/1978 | Gerkema et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,356,673 A | 10/1994 | Schmitt et al. |
| 5,382,333 A | 1/1995 | Ando et al. |
| 5,438,028 A | 8/1995 | Weissman et al. |
| 5,443,647 A | 8/1995 | Aucoin et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,820,965 A | 10/1998 | Pyzik et al. |
| 5,855,680 A | 1/1999 | Soininen et al. |
| 5,915,004 A | 6/1999 | Pabbati et al. |
| 5,916,365 A | 6/1999 | Sherman |
| 5,946,598 A | 8/1999 | Yeh |
| 5,947,710 A | 9/1999 | Cooper et al. |
| 5,961,365 A | 10/1999 | Lambert |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,200,893 B1 | 3/2001 | Sneh |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntoloa et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,613,383 B1 | 9/2003 | George et al. |
| 6,616,982 B2 | 9/2003 | Merrill et al. |
| 6,632,279 B1 | 10/2003 | Ritala et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,838,125 B2 | 1/2005 | Chung et al. |
| 6,863,727 B1 | 3/2005 | Elers |
| 6,902,763 B1 | 6/2005 | Elers et al. |
| 6,936,535 B2 | 8/2005 | Kim et al. |
| 6,986,914 B2 | 1/2006 | Elers et al. |
| 7,045,406 B2 | 5/2006 | Huotari et al. |
| 7,138,336 B2 | 11/2006 | Lee et al. |
| 7,141,278 B2 | 11/2006 | Koh et al. |
| 7,144,806 B1 | 12/2006 | Fair et al. |
| 7,144,809 B2 | 12/2006 | Elers et al. |
| 7,211,144 B2 | 5/2007 | Lu et al. |
| 7,211,507 B2 | 5/2007 | Dunn et al |
| 7,211,508 B2 | 5/2007 | Chung et a |
| 7,268,078 B2 | 9/2007 | Iyer |
| 7,405,158 B2 | 7/2008 | Lai et al. |
| 7,416,981 B2 | 8/2008 | Lee et al. |
| 7,485,340 B2 | 2/2009 | Elers et al. |
| 7,485,349 B2 | 2/2009 | Koh et al. |
| 7,611,751 B2 | 11/2009 | Elers |
| 7,666,474 B2 | 2/2010 | Li et al. |
| 7,749,871 B2 | 7/2010 | Elers et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0032281 A1 | 2/2003 | Werkhoven et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |

(56) References Cited

U.S. PATENT DOCUMENTS

| | | | |
|---|---|---|---|
| 2003/0194825 A1 | 10/2003 | Law et al. | |
| 2003/0203616 A1 | 10/2003 | Chung et al. | |
| 2003/0219942 A1 | 11/2003 | Choi et al. | |
| 2004/0130029 A1 | 7/2004 | Raaijmakers et al. | |
| 2004/0206008 A1 | 10/2004 | Sung | |
| 2004/0208994 A1 | 10/2004 | Harkonen et al. | |
| 2004/0224504 A1 | 11/2004 | Gadgil | |
| 2004/0231799 A1 | 11/2004 | Lee et al. | |
| 2005/0037557 A1* | 2/2005 | Doczy | C04B 35/5618 438/197 |
| 2005/0064247 A1 | 3/2005 | Sane et al. | |
| 2005/0095443 A1 | 5/2005 | Kim | |
| 2005/0095763 A1 | 5/2005 | Samavedam et al. | |
| 2005/0106877 A1 | 5/2005 | Elers et al. | |
| 2005/0271813 A1 | 12/2005 | Kher et al. | |
| 2006/0019494 A1 | 1/2006 | Cao et al. | |
| 2006/0063395 A1 | 3/2006 | Lee | |
| 2006/0079090 A1 | 4/2006 | Elers et al. | |
| 2006/0147626 A1 | 7/2006 | Blomberg | |
| 2006/0165892 A1 | 7/2006 | Weidman | |
| 2006/0211224 A1 | 9/2006 | Matsuda et al. | |
| 2006/0220249 A1 | 10/2006 | Johnston et al. | |
| 2006/0223300 A1* | 10/2006 | Simka et al. | 438/618 |
| 2006/0240187 A1 | 10/2006 | Weidman | |
| 2006/0251812 A1 | 11/2006 | Kang et al. | |
| 2007/0018342 A1 | 1/2007 | Sandhu et al. | |
| 2007/0069177 A1 | 3/2007 | Peters et al. | |
| 2007/0148350 A1* | 6/2007 | Rahtu et al. | 427/249.17 |
| 2007/0218670 A1 | 9/2007 | Ishizaka | |
| 2008/0102204 A1 | 5/2008 | Elers | |
| 2008/0102205 A1 | 5/2008 | Barry et al. | |
| 2008/0113110 A1 | 5/2008 | Elers et al. | |
| 2008/0182411 A1 | 7/2008 | Elers | |
| 2008/0274617 A1 | 11/2008 | Milligan | |

FOREIGN PATENT DOCUMENTS

| | | |
|---|---|---|
| EP | 0 442 490 | 8/1991 |
| EP | 0 526 779 | 2/1993 |
| EP | 0 528 779 | 2/1993 |
| EP | 0 573 033 | 12/1993 |
| EP | 0 774 533 | 5/1997 |
| EP | 0 899 779 | 3/1999 |
| EP | 1 158 070 | 11/2001 |
| EP | 1 167 567 | 1/2002 |
| JP | 58-033841 | 2/1983 |
| JP | 06-037041 | 2/1994 |
| JP | 06-069157 | 3/1994 |
| JP | 07-230957 | 8/1995 |
| JP | 08-264530 | 10/1996 |
| JP | 09-087857 | 3/1997 |
| KR | 10-2001-0088044 | 12/2001 |
| KR | 10-2002-0031160 | 6/2002 |
| KR | 10-2002-0087192 | 12/2002 |
| KR | 10-2003-0005727 | 1/2003 |
| KR | 10-2003-0014115 | 3/2003 |
| KR | 10-2003-0014117 | 3/2003 |
| KR | 10-2003-0033234 | 5/2003 |
| KR | 10-2003-0040758 | 6/2003 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/61833 | 8/2001 |
| WO | WO 01/66832 | 9/2001 |
| WO | WO 01/78123 | 10/2001 |
| WO | WO 01/78213 | 10/2001 |
| WO | WO 01/88972 | 11/2001 |
| WO | WO 03/102265 | 12/2003 |
| WO | WO 2004/077515 | 9/2004 |
| WO | WO 2006/080782 | 8/2006 |
| WO | WO 2006/093260 | 9/2006 |
| WO | WO 2008/137399 | 4/2008 |

OTHER PUBLICATIONS

1988RD-0296076 (Nov. 20, 1998), "Field Effect Transistor Structure with Improved Transconductant—Contg. Spacer-less Conducting Gate Oxide, and Tungsten Deposited on Source and Drain", EAST Version 2.0.1.4 Patent-Assignee: Anonymous[Anon], Sep. 19, 2005.

Aggarwal et al., "Predictors of Mortality and Resource Utilization in Cirrhotic Patients Admitted to the Medical ICU*", Chest, May 2001, vol. 5, Issue 119, pp. 1489-1497.

Andricacos et al., "Damascene Copper Electroplating for Chip", IBM Jour. Research and Dev., 1998, vol. 42, Issue 567.

Bain et al., "Deposition of Tungsten by Plasma Enhanced Chemical Vapour Deposition", J. Phys. IV France, 1999, vol. 9, pp. 827-833.

Chang et al., "Chemical Vapor Deposition of Tantalum Carbide and Carbonitride Thin Film from $Me_3CE=Ta(CH_2CMe_3)_3$ (E=Ch, N)", The Royal Society of Chemistry, 2003, pp. 365-369.

Elers et al., "$NbCl_5$ as a Precursor in Atomic Layer Epitaxy", Applied Surface Science, Jul. 9, 1994, vol. 82/83, pp. 468-474.

European Search Report dated May 5, 2008, Application No. 08 000 724.8.

Fuyuki et al., "Atomic Layer Epitaxy of Cubic SiC by Gas Source MBE Using Surface Superstructure", J. Cryst. Growth, 1989, vol. 95, Issue 1-4, pp. 461-463.

Fuyuki et al., "Atomic Layer Epitaxy Controlled by Surface Superstructures in Silicon Carbide", Thin Solid Films, 1993, vol. 225, Issue 1-2, pp. 225-229.

Girolami et al., "Tailored Organometallics as Low-Temperature CVD Precursors to Thin Films", Materials Research Society Symposium Proceedings, 1988, vol. 121, pp. 429-438.

Hara et al., "Atomic Layer Control of $\beta$-SiC(001) Surface", Springer Proc. Phys., 1992, vol. 71, pp. 90-95.

Hiltunen et al., "Nitrides of Titanium, Niobium, Tantalum and Molybdenum Grown as Thin Films by the Atomic Layer Epitaxy Method", Thin Solid Films, 1988, vol. 166, pp. 149-154.

Hultman et al., "Review of the Thermal and Mechanical Stability of TiN-based Thin Films", Zeitscrift Fur Metallkunde, 1999, vol. 90, Issue 10, pp. 803-813.

Ihanus et al., "ALE Growth of $ZnS_{1-x}Se_x$ Thin Films by Substituting Surface Sulfur with Elemental Selenium", Appl. Surface Sci., 1997, vol. 112, pp. 154-158.

International Preliminary Examination Report mailed May 7, 2009 and International Search Report mailed Jan. 31, 2008 for Application No. PCT/US2007/081960.

International Search Report and Written Opinion dated Apr. 7, 2008, Application No. PCT/US2007/082131.

International Search Report and Written Opinion dated Jan. 31, 2008, Application No. PCT/US2007/081960.

International Search Report mailed Sep. 17, 2008 for Application No. PCT/US2008/061845.

International Search Report and Written Opinion dated Apr. 15, 2010, Application No. PCT/US2009/040705.

Jehn et al., "Gmelin Handbook of Inorganic and Organometallic Chemistry," 8th Edition, 1993, vol. A 5b, pp. 131-154.

Jeon, "Study on the Characteristics of TiN Thin Film Deposited by Atomic Layer Chemical Vapor Deposition Method", AVS 46th International Symposium, 1999, Issue abstract TF-MoP17, Seattle, WA.

(56) References Cited

OTHER PUBLICATIONS

Jeon et al., "A Study on the Characteristics of TiN Thin Film Deposited by Atomic Layer Chemical Vapor Deposition Method", J. Vac .Sci. Technol. A, Jul./Aug. 2000, vol. 18, Issue 4, pp. 1595-1598.
Juppo et al., "Deposition of Copper Films by an Alternate Supply of CuCl and Zn", J. Vac. Sci. Technol A, Jul./Aug. 1997, vol. 15, Issue 4, pp. 2330-2333.
Kattelus et al., "Electrical Properties of Tantalum Based Composite Oxide Films", Mat. Res. Soc. Symp. Proc., 1993, vol. 284, pp. 511-516.
Kattelus et al., "Layered Tantalum-Aluminum Oxide Films Deposited by Atomic Layer Epitaxy", Thin Solid Films, 1993, vol. 225, pp. 296-298.
Kim et al., "Atomic-Layer-Depositied $WN_xC_y$ Thin Films as Diffusion Barrier for Copper Metallization", Applied Physics Letters, Jun. 23, 2003, vol. 82, Issue 25, pp. 4486-4488.
Kim et al., "Novel Capacitor Technology for High Density Stand-Alone and Embedded DRAMs," IEDM, IEEE International Electron Devices Meeting, 2000, pp. 3.
Kirk-Othmer, "Encyclopedia of Chemical Technology," 4th Edition, John Wiley & Sons, Inc., 1992, vol. 4, pp. 841-878.
Klaus et al., "Atomically Controlled Growth of Tungsten and Tungsten Nitride Using Sequential Surface Reactions", Applied Surface Science, 2000, vol. 162-163, pp. 479-491.
Klaus et al., "Atomic Layer Deposition of Tungsten and Tungsten Nitride Using Sequential Surface Reactions", AVS 46th International Symposium, 1999, Issue abstract TF-TuM6, Seattle, WA.
Klaus et al., "Atomic Layer Deposition of Tungsten Nitride Films Using Sequential Surface Reactions", Journal of the Electrochemical Society, 2000, vol. 147, Issue 3, pp. 1175-1181.
Kukli et al., "Properties of Atomic Layer Deposited $(Ta_{1-x}Nb_x)_2O_5$ Solid Solution Films and $Ta_2O_5$-$Nb_2O_5$ Nanolaminates", J. Appl. Phys., Nov. 1999, vol. 86, Issue 10, pp. 5656-5662.
Lai et al., "Precursors for Organometallic Chemical Vapor Deposition of Tungsten Carbide Films", Chem. Mater., 1995, vol. 7, pp. 2284-2292.
Lakomaa et al., "Surface Reactions in $Al_2O_3$ Growth from Trimethylaluminum and Water by Atomic Layer Epitaxy", Applied Surface Science, 1996, vol. 107, pp. 107-115.
Leskelä et al., "ALD Precursor Chemistry: Evolution and Future Challenges", Jour. Phys. IV France 9, 1999, pp. 837-852.
Ludviksson et al., "Low-Temperature Thermal CVD of Ti—Al Metal Films Using a Strong Reducing Agent", Chem. Vap. Deposition, 1998, vol. 4, Issue 4, pp. 129-132.
Martensson, "Use of Atomic Layer Epitaxy for Fabrication of Si/TiN/Cu Structures", J. Vac. Sci. Technol. B, Sep./Oct. 1999, vol. 17, Issue 5, pp. 2122-2128.
Martensson et al., "Atomic Layer Epitaxy of Copper and Tantalum", Chemical Vapor Deposition, 1997, vol. 3, Issue 1, pp. 45-50.
Martensson et al., "CU(THD)$_2$ As Copper Source in Atomic Layer Epitaxy", Electrochemical Society Proceedings, vol. 97-25, pp. 1529-1536.
Matsunami et al., "Hetero-Interface Control and Atomic Layer Epitaxy of SiC.", Applied Surface Science, 1997, vol. 112, pp. 171-175.
Min et al., "Atomic Layer Deposition of TiN Films by Alternate Supply of Tetrakis (ethylmethylamino)-Titanium and Ammonia", Jpn. J. Appl. Phys., 1998, vol. 37, pp. 4999-5004.
Min et al., "Atomic Layer Deposition of TiN Thin Films by Sequential Introduction of Ti Precursor and $NH_3$", Mat. Res. Soc. Symp. Proc., 1998, vol. 514, pp. 337-342.
Nakajima et al., "Chemical Vapor Deposition of Tungsten Carbide, Molybdenum Carbide Nitride, and Molybdenum Nitride Films", J. Electrochem. Soc., Jun. 1997, vol. 144, Issue 6, pp. 2096-2100.
Park et al., "Plasma-Enhanced Atomic Layer Deposition of Ta—N Thin Films", Journal of the Electrochemical Society, Electrochemical Society, Jan. 2002, vol. 149, Issue 1, pp. C28-C32, Manchester, New Hampshire.
Polyakov et al., "Growth of GaBN Ternary Soloutions by Organometallic Vapor Phase Epitaxy", Journal of Electronic Materials, 1997, vol. 26, Issue 3, pp. 237-242.
Riihela et al., "Introducing Atomic Layer Epitaxy for the Deposition of Optical Thin Films", Thin Solid Films, 1996, vol. 289, pp. 250-255.
Ritala et al., "Atomic Layer Epitaxy Growth of TiN Thin Films from $TiI_4$ and $NH_3$", J. Electrochem. Soc., Aug. 1998, vol. 145, Issue 8, pp. 2914-2920.
Ritala et al., "Effects of Intermediate Zinc Pulses on Properties of TiN and NbN Films Deposited by Atomic Layer Epitaxy", Appl. Surf. Sci., 1997, vol. 120, pp. 199-212.
Ritala et al., Perfectly Conformal TiN and $Al_2O_3$ Films Deposited by Atomic Layer Deposition, Chem. Vapor Deposition, 1999, vol. 5, Issue 1.
Ritala et al., "Atomic Layer Epitaxy Growth of TiN Thin Films", J. Electrochem. Soc., 1995, vol. 142, Issue 8, pp. 2731-2737.
Ritala et al., "Controlled Growth of TaN, $Ta_3N_5$, and $TaO_xN_y$ Thin Films by Atomic Layer Deposition", Chem. Mater, 1999, vol. 11, pp. 1712-1718.
Ritala et al., "Surface Roughness Reduction in Atomic Layer Epitaxy Growth of Titanium Dioxide Thin Films", Thin Solid Films, 1994, vol. 249, pp. 155-162.
Ryu et al., "Barriers for Copper Interconnections", Solid State Technology, Apr. 1999, vol. 53.
Sadayuki et al., "Sub-Atomic Layer Growth of SiC at Low Temperatures," Part 1: Regular Papers, Short Notes & Review Papers, Japanese Journal of Applied Physics, Nov. 1995, vol. 34, Issue 11, pp. 6166-6170.
Sherman et al., "Plasma Enhanced Atomic Layer Deposition of Ta for Diffusion Barrier Applications", AVS 46th International Symposium, Oct. 26, 1999, Seattle, WA, U.S.
Suntola, "Atomic Layer Epitaxy", Handbook of Crystal Growth, 1994, vol. 3, pp. 601-663.
U.S. Appl. No. 11/288,872, filed Nov. 25, 2005, titled "Method for depositing nanolaminate thin films on sensitive surfaces," listing as inventor Elers et al.
U.S. Appl. No. 12/116,894, filed May 7, 2008, titled "Plasma-enhanced pulsed deposition of metal carbides," listing as Inventor Li et al.
Tulhoff et al., "Ullmann's Encyclopedia of Industrial Chemistry," 5th, Completely Revised Edition, 1986, vol. A5, pp. 61-77.
U.S. Appl. No. 11/288,872, filed Nov. 25, 2005; Office Action mailed Jul. 2, 2007; Notice of Allowance mailed Feb. 25, 2010.
U.S. Appl. No. 11/591,845, filed Nov. 1, 2006; Office Action mailed Sep. 4, 2008; Notice of Allowance mailed Sep. 4, 2009.
U.S. Appl. No. 12/116,894, filed May 7, 2008; Office Action mailed May 5, 2009; Notice of Allowance mailed Nov. 16, 2009.
U.S. File History printed Jun. 18, 2009 for U.S. Appl. No. 11/873,250, filed Oct. 16, 2007, entitled "Plasma-Enhanced Deposition of Metal Carbide Films".
U.S. File History printed Jun. 23, 2009 for U.S. Appl. No. 11/591,845, filed Nov. 1, 2006, entitled "Vapor Deposition of Metal Carbide Films".
Utriainen et al., "Controlled Electrical Conductivity in $SnO_2$ Thin Films by Oxygen or Hydrocarbon Assisted Atomic Layer Epitaxy", J. Electrochem. Soc., 1999, vol. 146, Issue 1, pp. 189-193.
Yang et al., "Atomic Layer Deposition of Tungsten Film from $WF_6$/$B_2H_6$: Nucleation Layer for Advanced Semiconductor Devices," Advanced Metallization Conference 2001, (AMC 2001), Conference Proceedings ULSI XVII@2002, Materials Research Society, pp. 655-660.
Zhang et al., "High Permittivity Thin Film Nanolaminates", Journal of Applied Physics, 2000, vol. 87, Issue 4, pp. 1921-1924.
Office Action dated Dec. 11, 2003 in Taiwanese Application No. 098112674 with English Translation.
Notice of Allowance dated May 1, 2015 in Korean Application No. 10-2010-7023348.
Xiang, et al., "Investigation of N Type Metal TiAlC by Thermal Atomic Layer Deposition Using $TiCl_4$ and TEA as Precursors", ECS Journal of Solid State Science and Technology, 5 (5), p. 299-303 (2016).

(56) References Cited

OTHER PUBLICATIONS

Xiang, et al., "Investigation of TiAlC by Atomic Layer Deposition as N Type Work Function Metal for FinFET", ECS Journal of Solid State Science and Technology, 4 (12), p. 441-444 (2015).

* cited by examiner

ATOMIC LAYER DEPOSITION OF METAL CARBIDE FILMS USING ALUMINUM HYDROCARBON COMPOUNDS

REFERENCE TO RELATED APPLICATIONS

The present application is a continuation of U.S. application Ser. No. 12/424,470, filed Apr. 15, 2009, now abandoned, which claims priority under 35 U.S.C. §119(e) to U.S. provisional application No. 61/045,554, filed Apr. 16, 2008, each of which is hereby incorporated by reference in its entirety.

BACKGROUND OF THE INVENTION

Field of the Invention

The present invention relates generally to vapor deposition processes and, more particularly, to deposition of metal carbide films by vapor deposition processes.

Description of the Related Art

Metal carbides have found use in various applications in the electronics industry, from gate electrodes to diffusion barriers. For example, tantalum carbide (TaC) is a low resistivity metal that can be used as an n-type metal oxide semiconductor (NMOS) gate electrode. Further, TaC has been found to be effective at inhibiting electromigration of noble metal atoms at the interface between metal interconnects and metal lines.

Generally, carbides of transition metal elements are in groups 4, 5, 6, 7, 8, 9, and 11 of the periodic table. Transition metal carbides are relatively inert, have very high melting points, are extremely hard and wear resistant, and have high thermal conductivity and metal-like electrical conductivity.

Transition metal carbides can have a wide range of compositions. Ordered and disordered carbon deficient forms exist, of which the tungsten carbides, $WC_x$, are examples. In these forms, carbon resides in the interstitial cavities between metal atoms.

Metal carbide films have been formed by various methods including chemical vapor deposition (CVD), physical vapor deposition (PVD) and atomic layer deposition (ALD).

A "thermal" ALD method of forming metal carbide films, wherein the substrate is sequentially and alternately contacted with vapor phase pulses of two or more source chemicals, is described in, for example, U.S. Pat. No. 6,482,262. According to the methods described therein, a transition metal source chemical and carbon source gas are alternately and sequentially pulsed into a reaction space comprising a substrate, which is maintained at an elevated temperature. The pulsing sequence is repeated to form a metal carbide (e.g., TaC) film of desired thickness. Due to the self-limiting nature of ALD, films are grown at rate of about one monolayer (ML) per deposition cycle.

A CVD method of depositing tungsten carbide from tungsten hexafluoride, hydrogen and a carbon-containing gas has been described in, for example, international patent application WO 00/47796. The carbon-containing compound is initially thermally activated. All of the gaseous source chemicals are introduced into a reaction space at the same time, resulting in the deposition of nonvolatile tungsten carbide on the substrate. A CVD reaction of $WF_6$ with trimethylamine and $H_2$ has been disclosed to yield WC films at 700° C.-800° C. and beta-$WC_x$ films at 400° C.-600° C. (Nakajima et al., J. Electrochem. Soc. 144 (1997) 2096-2100). The $H_2$ flow rate was found to affect the deposition rate of the tungsten carbide films. A problem with the disclosed process is that the substrate temperature is rather high relative to thermal budgets for state-of-the-art semiconductor fabrication, particularly in metallization stages.

PVD processes generally deposit along a line-of-sight. One method of depositing tantalum carbide for a diffusion barrier layer by PVD has been described in U.S. Pat. No. 5,973,400. A tantalum carbide layer was formed by sputtering tantalum or tantalum carbide under an $N_2/CH_4/Ar$ atmosphere. Line-of-sight deposition, however, means that complex substrate contours will have insufficient film coverage in shaded areas. Additionally, line-of-sight deposition means that low-volatility source material arriving directly from the source to the substrate will likely adhere to the first solid surface that it encounters, thus producing low-conformality coverage.

SUMMARY OF THE INVENTION

According to one aspect of the invention, methods for growing a metal carbide film over a substrate are provided. The methods generally comprise contacting a substrate in a reaction space with a first reactant that includes a metal source chemical and a second reactant that includes an aluminum hydrocarbon compound, thereby forming the metal carbide film over the substrate. The metal carbide film preferably comprises aluminum.

According to some embodiments of the invention, atomic layer deposition (ALD) processes for forming a metal carbide thin film on a substrate in a reaction space are provided. The methods comprising: alternately and sequentially contacting the substrate with vapor phase pulses of a first metal precursor and a first aluminum hydrocarbon compound, such that a metal carbide film comprising from about 6 to about 16% aluminum is formed. In some embodiments the aluminum hydrocarbon compound comprises one or more of trimethyl aluminum (TMA), triethyl aluminum (TEA), and dimethylaluminumhydride (DMAH).

In another aspect of the invention, metal carbide film comprising aluminum are deposited using aluminum hydrocarbon compounds. The amount of the aluminum can be controlled by selecting an appropriate aluminum hydrocarbon compound as the second reactant. Other reaction conditions, such as temperature pressure, pulse and purge length and plasma, can also be adjusted to achieve a desired aluminum concentration. In some embodiments the aluminum concentration is about 6%. In other embodiments the aluminum concentration is up to about 16%. However, higher concentrations are possible. By controlling the amount of aluminum, films with desirable characteristics can be formed, including low resistivity, good adhesion, and oxidation resistance.

In some embodiments, the resistivity of the metal carbide film is controlled by selecting appropriate deposition conditions, including the aluminum hydrocarbon reactant, the deposition temperature and the deposition pressure.

In another aspect of the invention, methods of making metal carbides with good adhesion properties are provided. In some embodiments, tantalum carbide films are deposited by ALD using tantalum halide precursors and TEA.

In other embodiments, the oxidation resistance of a metal carbide film is controlled by controlling the amount of aluminum in the metal carbide film. The amount of aluminum can be controlled by selection of an aluminum hydrocarbon reactant for use in an ALD process as a carburizing agent and by adjusting other reaction conditions.

In some embodiments methods of forming a metal carbide thin film with a desired level of oxidation resistance are provided. The methods comprise: depositing a metal carbide thin film by alternately and sequentially contacting a substrate with vapor phase pulses of a metal precursor and an aluminum hydrocarbon compound, wherein one or more reaction conditions are selected to produce a desired concentration of aluminum in the metal carbide thin film, and wherein the concentration of aluminum in the metal carbide is from about 1 to about 30%.

In other embodiments, the work function of a gate electrode is determined by controlling the amount of aluminum in a metal carbide film. The gate electrode may be, for example, a control gate in a flash memory structure or a gate electrode in a CMOS transistor. A gate stack can comprise a first gate electrode layer and a second gate electrode layer. The first gate electrode layer comprises a first metal carbide gate electrode material and the second gate electrode layer comprises a second gate electrode material, such as polysilicon, titanium or tantalum nitride or tungsten. Preferably the first and second gate electrode materials are conductive. In preferred embodiments, the first gate electrode material is different from the second gate electrode material. The work function of the gate electrode may be determined by the first metal carbide gate electrode material.

Methods for forming a flash memory comprising a metal carbide layer are also provided. In preferred embodiments a dielectric layer (tunnel oxide) is deposited over a substrate and a floating gate is deposited directly over the dielectric layer. The floating gate may comprise, for example, polysilicon. In some embodiments, such as for a TaNOS flash structure, a charge trap layer is used in place of the floating gate. The charge trap layer may be silicon nitride. A barrier oxide, such as $AlO_2$, is deposited over the floating gate or charge trap layer and a control gate is formed over the barrier oxide.

In some embodiments the methods for forming a flash memory on a substrate comprise: forming a dielectric layer on the substrate; forming a charge trap layer directly over and adjacent to the dielectric layer; forming a barrier oxide directly over and adjacent to the charge trap layer: forming a metal carbide control gate over the barrier oxide; etching the dielectric layer, charge trap layer, barrier oxide and control gate to form a flash structure; and passivating the flash structure by depositing $SiO_2$, wherein the metal carbide control gate comprises aluminum and during the deposition of $SiO_2$ the aluminum in the metal carbide reacts with oxygen to self-passivate the control gate.

Forming the control gate preferably comprises depositing a metal carbide gate electrode layer by ALD using one or more aluminum hydrocarbon compounds, such that the metal carbide layer controls the work function of the control gate. The metal carbide layer is preferably deposited to a thickness of about 1 to 1000 Å, more preferably about 1 to 500 Å, and still more preferably about 25 to 200 Å. The deposition conditions, including temperature, pressure and reactant choice are adjusted to achieve a desired amount of aluminum in the metal carbide layer and thus produce the desired work function and other characteristics. For example, the aluminum content is preferably such that the film has good oxidation resistance and is able to self-passivate during subsequent patterning and/or deposition steps.

A further conductive layer, such as a polysilicon, metal or metal nitride layer, for example a titanium nitride or tungsten layer, may be deposited over the first gate electrode layer. The structure is then patterned, etched and passivated, for example with silicon oxide. During the passivation process, the edges of the metal carbide layer are exposed and the aluminum in the metal carbide reacts with oxygen to self-passivate the remaining metal film.

All of these embodiments are intended to be within the scope of the invention herein disclosed. These and other embodiments of the present invention will be readily apparent to those skilled in the art from the following detailed description of the preferred embodiments having reference to the attached figure, the invention not being limited to any particular preferred embodiment(s) disclosed.

BRIEF DESCRIPTION OF THE DRAWINGS

The invention will be better understood from the Detailed Description of the Preferred Embodiments and from the appended drawing, which is meant to illustrate and not to limit the invention, and wherein.

DETAILED DESCRIPTION OF CERTAIN EMBODIMENTS

Figure 1:
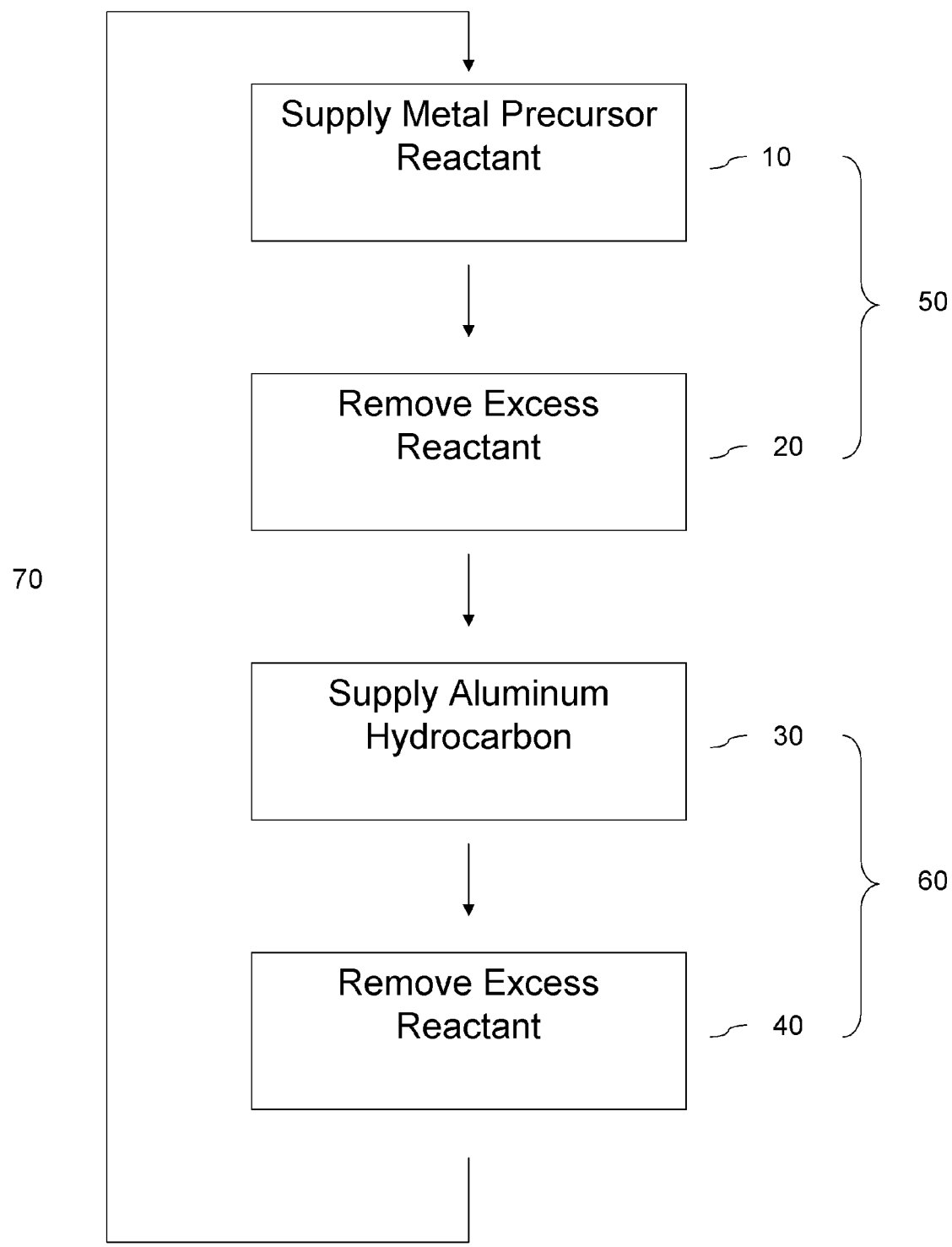
FIG. 1 is a block diagram of a pulsing sequence in an ALD-type process according to some embodiment.

Metal carbide films, e.g., tantalum carbide (TaC) films, can be used to form various structures, such as control electrodes for flash memory structures. In such applications, it is desirable for the films to have good adhesion to underlying materials and also low resistivity and good oxidation resistance.

Metal carbide films with desirable properties can be formed by employing aluminum hydrocarbon compounds to carburize a metal film on a substrate. In some embodiments of the present invention, metal carbide films are formed over a substrate in ALD-type processes by contacting the substrate with alternating and sequential pulses of a metal compound and a carbon-containing compound, where the carbon containing compound is an aluminum hydrocarbon compound.

Using the methods and compositions described herein, metal carbide films with a controlled aluminum content can be formed on a substrate. A substrate in a reaction space is contacted with a vapor phase metal source chemical (or metal compound) and an aluminum hydrocarbon compound. The films preferably have good adhesion, low resistivity and good oxidation resistance. The characteristics of the metal carbide films including aluminum content, adhesion, resistivity and/or oxidation resistance can be controlled by selecting the appropriate aluminum hydrocarbon reactant. The reaction conditions, such as the reaction temperature, pressure, pulse and purge times, pulsing sequence and post deposition annealing can also be adjusted to achieve films with the desired properties. In some embodiments, the desired film characteristics may be achieved by using a plasma enhanced ALD process.

By selecting an appropriate aluminum hydrocarbon compound and appropriate reaction conditions, a metal carbide film with properties that are advantageous to a particular situation can be formed. For example, in some embodiments a film with low resistivity is formed using TMA, TEA or DMAH as the aluminum hydrocarbon compound. Films with good adhesion can be obtained in some embodiments using TEA and a metal halide reactant, such as $TaCl_5$. Oxidation resistant films can be formed in some embodiments by selecting reactants and conditions that provide a desired level of aluminum in a metal carbide film. For example, in some embodiments films with an aluminum concentration of about 1-30%, more preferably about 6-16% are deposited in order to obtain a desired level of oxidation resistance.

Although described herein primarily in the context of flash memory applications, the metal carbide films and deposition processes can find use in a variety of contexts, as will be recognized by the skilled artisan. For example, the metal carbide film formed can be a component of an integrated circuit (IC), such as, e.g., a conductive diffusion barrier forming a part of a line in a dual damascene structure, a metal gate electrode in a CMOS transistor, such as an NMOS or PMOS gate electrode (depending on the aluminum concentration), or an anti-reflective coating. In other embodiments, the metal carbide film may form a part of hard coating on a substrate to protect against mechanical wear, or may be used as a component of a corrosion protection layer. In still other embodiments, the metal carbide film can be, e.g., used as part of a chemical reaction catalyst or as an etch stop barrier.

DEFINITIONS

In context of the present disclosure, an "ALD process" or "ALD type process" generally refers to a process for producing a film over a substrate monolayer (molecular layer) by monolayer using self-saturating chemical reactions. The general principles of ALD are disclosed, e.g., in T. Suntola in, e.g. the Handbook of Crystal Growth 3, Thin Films and Epitaxy, Part B: Growth Mechanisms and Dynamics, Chapter 14, Atomic Layer Epitaxy, pp. 601-663, Elsevier Science B.V. 1994, and U.S. Pat. Nos. 4,058,430 and 5,711,811, the disclosures of which are incorporated herein by reference. In an ALD process, gaseous reactants, i.e., precursors or source materials are alternately and sequentially conducted into a reaction space where they contact a substrate to provide a surface reaction. Reaction conditions are selected such that generally only up to about one monolayer (i.e. an atomic layer or a molecular layer) of material is deposited at a time during each pulsing cycle. Gas phase reactions between precursors and any undesired reactions of byproducts are inhibited because precursor pulses are separated from each other and the reaction chamber is purged with an inactive gas (e.g. nitrogen, argon, or hydrogen) and/or evacuated using, e.g., a pumping system between precursor pulses to remove surplus gaseous reactants and reaction byproducts, if any, from the chamber. Thus, the concentration profiles of the reactants in the reaction space with respect to time are not overlapping. However, the skilled artisan will recognize that more than one monolayer may be deposited in one or more ALD cycles despite the separation of reactant pulses.

"Plasma-excited species" refers to radicals, ions or other excited species generated via application of energy to a gas. Plasma-excited species may be generated using a direct plasma generator (i.e., "in situ" or "direct" plasma generation) and/or a remote plasma generator (i.e., "ex situ" or "remote" plasma generation). Energy may be applied (or coupled) to a gas via a variety of methods, such as inductive coupling, ultraviolet radiation, microwaves, capacitive coupling, application of RF power, etc. In the absence of coupling energy, plasma generation is terminated. Plasma-excited species include, without limitation, hydrogen and nitrogen radicals.

"Plasma parameters" is used to designate one or more plasma generation variables, including, without limitation, plasma generator power, gas pressure, gas (or reactant) flow rate, and plasma pulse duration. As an example, for plasma generation using RF power, plasma parameters include, without limitation, radio frequency (RF) power on time, RF power amplitude, RF power frequency or frequencies (for dual frequency systems), reactant concentration, reactant flow rate, reaction space pressure, total gas flow rate, reactant pulse durations and separations, and RF electrode spacing.

"Reaction space" is used to designate a reactor or reaction chamber ("chamber"), or an arbitrarily defined volume therein, in which conditions can be adjusted to effect film growth. The reaction space can be, for example, in a single-wafer ALD reactor or a batch ALD reactor, where deposition on multiple substrates takes place at the same time.

"Adsorption" is used to designate a chemical attachment of atoms or molecules on a surface.

"Substrate" is any surface on which deposition is desired, and in preferred embodiments can include any workpiece that is suitable for integrated circuit (IC) fabrication. Typical substrates include, without limitation, silicon, silica, coated silicon and high k materials, such as metal oxides.

"Surface" is used to designate a boundary between the reaction space and a feature of the substrate.

"Film" means a film that is grown on a substrate from elements or compounds that are transported as separate ions, atoms or molecules from a source to the substrate. The thickness of the film will depend upon the application and may vary in a wide range, preferably from one atomic layer to 100 nanometers (nm) or more. In some embodiments, such as where the film serves to set the work function in a flash memory, the thickness may be about 25 Å to 200 Å, although in some embodiments it may be as high as 500 Å or even 1000 Å. In other embodiments the film is less than about 200 Å in thickness, even more preferably less than about 100 Å, and most preferably less than about 50 Å, such as for a CMOS gate application.

"Metal carbide film" designates a film comprising at least one metal and carbon. The metal may be a single elemental metal or a plurality of metals, such as a metal alloy. The metal carbide film may be stoichiometric, e.g., TaC, or non-stoichiometric, e.g., $TaC_x$, where 'x' is greater than one if the film has excess carbon or less than one if the film is carbon deficient. In preferred embodiments, metal carbide films deposited according to the methods described herein comprise a first metal, carbon, and aluminum. The first metal is typically not aluminum.

ALD Methods

ALD is based on self-limiting reactions, whereby sequential and alternating pulses of reaction precursors are used to deposit about one atomic (or molecular) monolayer of material per deposition pulse. The deposition conditions and precursors are selected to provide self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses typically leaves no more than about one monolayer of the desired material. However, as mentioned above, the skilled artisan will recognize that in one or more ALD cycles more than one monolayer of material may be deposited, for example if some gas phase reactions occur despite separate provisions of the reactants.

In a typical ALD-type process for depositing metal carbide films, one deposition cycle comprises exposing the substrate to a first reactant, removing any unreacted first reactant and reaction byproducts from the reaction space, exposing the substrate to a second reactant, followed by a second removal step. The first reactant is preferably a metal precursor and the second reactant is preferably a carburizing (or carbon-contributing) compound (although it is possible to begin the process with either reactant).

The metal compound preferably comprises one or more metals selected from the group consisting of titanium (Ti), zirconium (Zr), hafnium (Hf), vanadium (V), niobium (Nb), tantalum (Ta), chromium (Cr), molybdenum (Mo), tungsten (W), manganese (Mn), rhenium (Re), iron (Fe), cobalt (Co), nickel (Ni), copper (Cu), silver (Ag), gold (Au), palladium (Pd), platinum (Pt), rhodium (Rh), iridium (Ir), ruthenium (Ru) and osmium (Os).

Typically, halide reactants, such as, e.g., $TaCl_5$ and $HfCl_4$, are used as metal precursors in ALD deposition because these precursors are inexpensive and relatively stable, but at the same time reactive towards different types of surface groups.

Carbon-contributing compounds are preferably aluminum hydrocarbon compounds. The aluminum hydrocarbon compound may be, for example, an alkane, alkene or alkyne. In some embodiments the aluminum hydrocarbon compound is selected from the group consisting of trimethyl aluminum (TMA), triethyl aluminum (TEA) and dimethylaluminum-hydride (DMAH).

The aluminum hydrocarbon compound is preferably selected to achieve desired characteristics in the metal carbide film. These include, without limitation, adhesion, resistivity, oxidation resistance and work function. In addition, by selecting an appropriate aluminum hydrocarbon compound and appropriate deposition conditions, the level of aluminum in the metal carbide film can be controlled. For example, to achieve a higher aluminum concentration in a particular film, TEA may be selected over TMA. In some embodiments, different aluminum hydrocarbon compounds may be used in different ALD deposition cycles to modify the aluminum incorporation in the metal carbide film. For example, in a deposition process to deposit a metal carbide layer a first ALD cycle may use a first aluminum compound and one or more ALD cycles may use a different aluminum compound.

The separation of precursors by inert gases, such as Ar, prevents gas-phase reactions between reactants and enables self-saturating surface reactions. Because the reactions self-saturate, strict temperature control of the substrates and precise dosage control of the precursors is not required. However, the substrate temperature is preferably such that an incident gas species does not condense into monolayers nor decompose on the surface. Surplus chemicals and reaction byproducts, if any, are removed from the reaction space before the next reactive chemical pulse is introduced into the chamber. Undesired gaseous molecules can be effectively expelled from the reaction space with the help of an inert purging gas. The purging gas directs the superfluous molecules out of the chamber. A vacuum pump may be used to assist in the purging.

According to some embodiments of the invention, an ALD-type process is used to form metal carbide films on a substrate, such as an integrated circuit workpiece. Preferably, each ALD cycle comprises two distinct deposition steps or phases. In a first phase of the deposition cycle ("the metal phase"), a first reactant comprising a metal (i.e., metal source material or chemical) is pulsed to the reaction space and chemisorbs onto the substrate surface, forming no more than about one monolayer on the surface of the substrate. The metal source material in this phase is selected such that, under the preferred conditions, the amount of metal source material that can be bound to the surface is determined by the number of available binding sites and by the physical size of the chemisorbed species (including ligands). The chemisorbed layer left by a pulse of the metal source chemical is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting.

The metal source material preferably includes a metal species desired in the film being deposited. In some embodiments, the metal source chemical, also referred to herein as the "metal compound," is a halide and the adsorbed monolayer is terminated with halogen ligands. In some embodiments, the metal compound is selected from the group consisting of metal bromides, metal chlorides, and metal iodides. As an example, a tantalum-containing metal carbide film can be deposited using a metal compound selected from the group consisting of $TaBr_w$, $TaCl_x$, and $TaI_z$, where w, x, y, and z are numbers from 1 to 5. In some embodiments, where a tantalum-carbide film is desired, $TaCl_5$ is used as the metal compound.

Excess metal source material and reaction byproducts (if any) are removed from the reaction space, e.g., by purging with an inert gas. Excess metal source material and any reaction byproducts may be removed with the aid of a vacuum generated by a pumping system.

Maximum step coverage on the workpiece surface is typically obtained when the metal source material forms no more than about a single monolayer in each self-limiting pulse. Due to the size of the chemisorbed species and the number of reactive sites, somewhat less than a monolayer may be deposited in each pulse of metal reactant. Thus, the maximum coverage of metal source material may be less than a monolayer. Depending on the process conditions in some embodiments it may be possible that more than one monolayer of first reaction is found on the substrate surface.

In a second phase of the deposition cycle ("carbon-contributing phase"), a second reactant, also referred to herein as a "second source chemical", is pulsed into the reaction space to react with the metal-containing molecules left on the substrate surface by the preceding pulse. The second source chemical is an aluminum hydrocarbon compound. Preferably, in the second phase carbon is incorporated into the film by the interaction of the second source chemical with the monolayer left by the metal source material. In preferred embodiments, reaction between the second source chemical and the chemisorbed metal species produces a metal carbide film over the substrate.

Aluminum may also be incorporated into the film in this second phase. Reaction conditions, including, without limitation, choice of reactant, temperature, pressure and pulse and purge times are adjusted to achieve a desired aluminum content in the film. In some embodiments the aluminum content may vary from about 0% to about 30%, more preferably from about 6% to about 16%. In other embodiments the aluminum content may be higher.

The aluminum hydrocarbon may be selected from the group consisting of alkanes, alkenes and alkynes. For example, the carbon-containing compound may be TMA, DMAH, or TEA. In some embodiments more than one aluminum hydrocarbon compound may be used. For example, two or more aluminum hydrocarbon compounds may be provided simultaneously in the same pulse. In other embodiments two or more different aluminum hydrocarbon compounds are provided in distinct ALD cycles with a single deposition process.

Excess second source chemical and reaction byproducts, if any, are removed from the reaction space by a purging gas pulse and/or vacuum generated by a pumping system. Purging gas is preferably any inert gas, such as, without limitation, argon (Ar) or helium (He). A phase is generally considered to immediately follow another phase if a purge (i.e., purging gas pulse) or other reactant removal step intervenes.

Additional reactants may be utilized in some embodiments, for example to reduce the deposited film or to incorporate a further species in the film. In some embodiments a third reactant may be a reducing agent, such as plasma-excited species of hydrogen generated by, e.g., an in situ or remote plasma generator. The reducing agent may be pulsed to the reaction space (or generated in the reaction space) after the metal phase and/or the carbon-contributing phase to reduce the deposited film. The reducing agent can be used, for example, to remove impurities, such as halogen atoms or oxidizing material (e.g., oxygen atoms) in the film and/or the substrate. It may also be used to control the incorporation of aluminum into the metal carbide film, thereby controlling the properties of the film. In some embodiments, thermal ALD and plasma ALD cycles are used in the same deposition process to control aluminum concentration in the deposited film. The ratio of thermal ALD cycles to plasma ALD cycles can be selected to achieve the desired aluminum concentration and/or concentration profile in the thin film.

In some embodiments, plasma parameters can be selected to modify the level of incorporation of aluminum into the metal carbide film and/or ratio of tantalum to carbon. That is, in some embodiments, film composition can be controlled as a function of plasma parameters. In addition to composition, other film characteristics such as crystallinity, crystal lattice constant, resistivity and crystal stress can be adjusted by selecting appropriate plasma parameters.

In some embodiments, plasma parameters are selected from relationships that have been established between plasma parameters and film composition and characteristics. "Plasma parameters" may include, for example, RF power and RF frequency. One plasma parameter, such as RF power, or multiple plasma parameters, i.e., a set of plasma parameters, such as RF power and RF frequency may be adjusted in one or more ALD cycles to achieve the desired film properties. Plasma parameters are preferably selected to yield a metal carbide film with a desired composition. In some cases plasma parameters are selected to form a gate electrode with a particular composition to yield a desired gate stack work function.

In some embodiments, deposition recipes for metal carbide films are determined or designed by selecting plasma parameters. As an example, the RF power may be selected to affect a stoichiometry as desired. As another example, a particular plasma pulse duration or RF power on time can be used to obtain a desired composition. As still another example, the desired composition may be achieved by selecting a combination of RF power, reactant pulse duration, and reactant flow rate.

Preferably, the plasma-excited species comprises hydrogen. Plasma-excited species of hydrogen may include, without limitation, hydrogen radicals (H*) and hydrogen cations (e.g., $H^+$, $H_2^+$). Plasma-excited species of hydrogen may be formed in situ or remotely, for example from molecular hydrogen ($H_2$) or hydrogen-containing compounds (e.g., silane, diborane, etc). In some embodiments, one or more of the reactants described herein can be provided as a plasma.

Relationships between deposition parameters such as plasma, reactants, etc. and thin film composition can be established by selecting parameter(s) and depositing a metallic carbide film by a particular atomic layer deposition process using the selected parameter(s) until a film of desired thickness is formed. The film composition and characteristics can then be determined and another film deposited using different parameters. This process can be repeated for different parameters to develop relationships between the parameters and film composition.

By selecting appropriate reaction conditions, a compound film with a composition as desired can be formed.

In one embodiment, formation of a metal carbide film via an ALD-type process comprises one or more deposition cycles, each comprising the steps of:

1. providing a metal compound to the reaction space;
2. purging and/or evacuating excess metal compound and reaction byproducts;
3. providing an aluminum hydrocarbon compound to the reaction space; and
4. purging and/or evacuating excess aluminum hydrocarbon compound and reaction byproducts from the reaction space.

Steps 1-4 can be referred to as a thermal ALD cycle. Steps 1-4 can be repeated as necessary to produce a metal carbide film of desired thickness and with a desired aluminum concentration. For example, steps 1-4 may be repeated up to 10, 100 or even 1000 or more times to produce metal carbide layers with uniform thicknesses ranging from one or several atomic layers to 100 nanometers (nm) or more. In some embodiments, steps 1-4 may be repeated until a metal carbide film is formed with a thickness of from about 1 to about 1000 Å, preferably less than about 1000 Å, more preferably less than about 500 Å. In some embodiments the film has a thickness of less than about 300 Å, and in other embodiments less than about 200 Å. In one embodiment, the thickness is preferably between about 100 Å and about 200 Å. In other embodiments the thickness is preferably from about 20 to about 200 Å. The skilled artisan will appreciate that the thickness of the metal carbide film can vary depending on the particular application. As an example, for NMOS gate applications, the thickness is typically from about 50 Å to about 500 Å. As another example, for MIM capacitor applications (e.g., DRAM, eDRAM, etc.) the thickness range is typically from about 50 Å to about 200 Å. Further, for applications in which the metal carbide thin film serves to set the work function in a flash memory, the thickness is preferably between about 20 Å and about 200 Å.

In some embodiments, steps 1 and 2 are repeated a predetermined number of times prior to steps 3 and 4. For example, steps 1 and 2 may be repeated five times prior to steps 3 and 4. As another example, steps 1 and 2 may be repeated ten times prior to steps 3 and 4. It should be understood that if a metal carbide film with compositional uniformity is desired, the number of times steps 1 and 2 are repeated should not exceed that which will prevent substantial carburization of the metal film. In one embodiment, the metal compound has a low decomposition temperature and the number of times steps 1 and 2 are repeated does not exceed one.

As discussed herein, selection of hydrocarbon aluminum reactants can be used to achieve deposition of films with desired characteristics, such as adhesion, resistivity, oxidation resistance and/or work function. In some embodiments multiple aluminum hydrocarbon compounds are used. In addition, various reaction conditions can be manipulated to achieve the desired film qualities and composition. These reaction conditions include, but are not limited to, reaction temperature, source container temperature, pressure, flow rate, plasma parameters and pulse and purge times.

In one embodiment, formation of a metal carbide film via an ALD-type process comprises two or more deposition cycles, a first cycle comprising the steps of:

1. providing a metal compound to the reaction space;
2. purging and/or evacuating excess metal compound and reaction byproducts;
3. providing a first aluminum hydrocarbon compound to the reaction space; and
4. purging and/or evacuating excess aluminum hydrocarbon compound and reaction byproducts from the reaction space.

and a second deposition cycle comprising the steps of:

5. providing a metal compound to the reaction space;
6. purging and/or evacuating excess metal compound and reaction byproducts;
7. providing a second aluminum hydrocarbon compound to the reaction space; and
8. purging and/or evacuating excess aluminum hydrocarbon compound and reaction byproducts from the reaction space.

The first and second cycles need not be consecutive and the ratio of first cycles to second cycles can be selected to achieve the desired composition.

In some embodiments, the deposition cycles can begin with any of the reactants. Preferably the first and second aluminum hydrocarbon compounds are different compounds. Preferably the first and second aluminum hydrocarbon compounds comprise TMA, TEA, or DMAH. In some embodiments, the first aluminum hydrocarbon compound comprises TEA and the second hydrocarbon compound comprises TMA. In some embodiments, multiple deposition cycles using TEA are performed followed by multiple deposition cycles using TMA.

In some embodiments, the ratios between the first aluminum hydrocarbon pulses and second hydrocarbon pulses are between about 1:100 and 100:1. Preferably the ratio between first and second aluminum hydrocarbon pulses is about 5:1 to about 1:5. In some embodiments the ratio between first and second aluminum hydrocarbon pulses is about 1:1.

In some embodiments plasma can be used during the deposition of the metal carbide film. In one embodiment, formation of a metal carbide film via an ALD-type process comprises one or more plasma ALD deposition cycles, each comprising the steps of:

1. providing a metal compound to the reaction space;
2. purging and/or evacuating excess metal compound and reaction byproducts;
3. providing a first aluminum hydrocarbon compound to the reaction space;
4. purging and/or evacuating excess aluminum hydrocarbon compound and reaction byproducts from the reaction space;
5. providing a plasma-excited species to the reaction space; and
6. purging and/or evacuating excess plasma source and reaction byproducts from the reaction space.

Steps 1-6 can be referred to as the plasma deposition cycle. In some embodiments the plasma source can be provided after the metal compound and before the aluminum hydrocarbon compound. In some embodiments, the deposition cycle can begin with any of the reactants. Preferably, the plasma-excited species comprises hydrogen.

In some embodiments plasma ALD cycles and thermal ALD cycles are used in the same deposition process. The ratio between the thermal ALD cycles and plasma ALD cycles is typically between about 1:100 and 100:1. Preferably the ratio between first and second aluminum hydrocarbon pulses is about 5:1 to about 1:5. In some embodiments the ratio between thermal and plasma ALD cycles is about 1:1.

The following general conditions apply to any of the deposition cycles disclosed herein. The reaction temperature is preferably from about 150° C. to about 550° C., more preferably from about 300° C. to about 400° C. In some embodiments the reaction temperature is about 350° C. to 375° C.

The reaction pressure is from about 0.5 to about 10 torr. In some embodiments the pressure is about 2 to about 7 torr. The pressure is preferably adjusted to achieve a desirable growth rate and acceptable uniformity.

In some embodiments the reactant vessel temperature can be selected to provide films with a desired characteristic. In some embodiments, the halide reactant vessel temperature is about 40° C. to about 80° C. For example, for the deposition of tantalum containing films using a $TaCl_5$ as a metal precursor, the reactant vessel temperature may be from about 45° C. to about 70° C., more preferably about 65° C.

The metal reactant pulse time is preferably from about 0.1 to about 20 seconds, more preferably from about 1 to about 10 seconds.

The aluminum hydrocarbon compound pulse time is preferably from about 0.1 to about 20 seconds, more preferably from about 0.5 to about 2 seconds. In some embodiments TMA is used as the aluminum hydrocarbon reactant and a pulse time of longer than about 1 second is used, more preferably about 2 seconds. In other embodiments TEA is used as the aluminum hydrocarbon reactant with a pulse time of about 1 second. In other embodiments DMAH is used as the aluminum hydrocarbon reactant with a pulse time of about 1 second. In other embodiments, two or more different aluminum hydrocarbon reactants can be used. In still other embodiments longer pulse times may be used. In some embodiments longer pulse times can be used for the aluminum hydrocarbon compound to affect the saturation of the compound on the substrate.

Purge times are generally from about 0.1 to about 10 seconds, more preferably about 2 to about 8 seconds. In some embodiments a purge time of about 6 seconds is used. However, in other embodiments longer purge times may be used. In some embodiments purge times are the same for purging the metal reactant and the aluminum hydrocarbon reactant, while in other embodiments the purge times are different for the different reactants.

Flow rates are generally from about 100 to about 400 sccm for the inert purge gas, such as Ar. The carrier flow for both metal precursors and aluminum hydrocarbons is preferably about 100 to about 400 sccm. The carrier gas is preferably an inert gas, such as Ar, and may be the same as or different from the purge gas. The flow rates of the purge and carrier gases can be determined based, in part, on the particular reactor, as will be appreciated by the skilled artisan.

With reference to FIG. 1, an exemplary embodiment for forming a metal carbide film by an ALD-type process is illustrated. After initial surface termination, if necessary, a first reactant or source material is supplied or pulsed 10 to the substrate or workpiece. In accordance with a preferred embodiment, the first reactant pulse comprises a carrier gas flow and a metal precursor, preferably a volatile halide compound that is reactive with the workpiece surfaces of interest. The halide compound comprises a metal species that is to form part of the metal carbide film. Accordingly, a metal-containing species adsorbs upon the workpiece surfaces. The first reactant pulse self-saturates the workpiece surfaces such that any excess constituents of the first reactant pulse do not further react with the monolayer formed by this process. Self-saturation is due to ligands, such as halide tails terminating the monolayer, protecting the layer from further reaction. In some embodiments the first reactant is a tantalum halide compound, such as $TaCl_5$.

Excess first reactant is then removed 20 from the reaction space. Preferably, step 104 merely entails stopping the flow of the first reactant or chemistry while continuing to flow a carrier gas (e.g., Ar or $H_2$) for a sufficient time to diffuse or purge excess reactants and reactant byproducts from the reaction space, preferably with greater than about two reaction chamber volumes of the purge gas, more preferably with greater than about three chamber volumes. Preferably, the removal 20 comprises continuing to flow purge gas for between about 0.1 seconds and 20 seconds after stopping the flow of the first reactant pulse. Inter-pulse purging is described in a co-pending U.S. patent application, having Ser. No. 09/392,371, filed Sep. 8, 1999 and entitled IMPROVED APPARATUS AND METHOD FOR GROWTH OF A THIN FILM, the disclosure of which is incorporated herein by reference. In other arrangements, the chamber may be pumped down between alternating chemistries. See, for example, PCT publication number WO 96/17107, published Jun. 6, 1996, entitled METHOD AND APPARATUS FOR GROWING THIN FILMS, the disclosure of which is incorporated herein by reference. Together, the adsorption 10 and reactant removal 20 represent the first phase 50 in the deposition cycle. The first phase 50 in the illustrated deposition cycle is thus the metal phase.

With continued reference to FIG. 1, a second reactant or source chemical is pulsed 30 to the workpiece. The second chemistry reacts with or adsorbs upon the monolayer left by the first reactant. In some embodiments, the second reactant removes ligands from the metal-containing species deposited in step 10. In the illustrated embodiment, the second reactant is an aluminum hydrocarbon compound that reacts with the layer deposited by the first reactant to form a metal carbide. The aluminum hydrocarbon compound deposits carbon in the metal layer formed in the metal phase. In some embodiments, the aluminum hydrocarbon compound is pulsed with a carrier gas (e.g., $H_2$), preferably an inert carrier gas (e.g., He, Ar).

After a time period sufficient to deposit carbon in the growing film, provision of the aluminum hydrocarbon compound is terminated and reaction byproducts (preferably also volatile), if any, are removed 40 from the reaction space, preferably by a purge gas. The removal can be as described for step 20. Together, steps 30 and 40 represent a second phase of the illustrated ALD process, which can also be referred to as the carbon-contributing phase 60.

Steps 10-40 may be repeated 70 to form a metal carbide layer of a desired thickness. The repeat step 70 may be excluded if a metal carbide film with a thickness of about one monolayer or less is desired.

For the ALD-type processes describe herein, the substrate is preferably maintained at a temperature from about 150° C. to about 550° C., more preferably from about 350° C. to about 400° C. The chamber is preferably maintained at a pressure from about 200 mTorr to about 10 Torr, more preferably from about 1 Torr to about 8 Torr.

In some embodiments, the first reactant is a tantalum halide, such as $TaCl_5$, the second reactant is an aluminum hydrocarbon compound such as TMA, DMAH, or TEA, and the film being formed is a tantalum carbide. The tantalum carbide film preferably comprises aluminum. In some embodiments the tantalum carbide film comprises from about 6 to about 16% aluminum.

In some embodiments, the film can be annealed after deposition. Annealing the film after deposition can modify the properties of the thin film. For example, annealing can modify the hydrogen and chlorine content of the film. Preferably, during annealing the substrate temperature is about 500° C. to about 1200° C. In some embodiments, the substrate temperature during the annealing step is about 600° C. to about 1000° C. Preferably, the annealing step is carried out in an inert atmosphere. Preferred inert atmospheres for annealing comprise nitrogen, helium, and argon. Preferably the pressure is around atmospheric pressure during the annealing step. In some embodiments, the pressure can be above or below atmospheric pressure. In some embodiments, the annealing atmosphere comprises a low oxygen partial pressure.

Flash Memory

Figure 2:
FIG. 2 is a schematic illustration of a flash memory structure formed according to some embodiments.

In some embodiments flash memory structures are provided in which a metal carbide film is deposited by ALD as described herein to form at least a part of the control gate. The main elements of an exemplary flash memory structure are illustrated in FIG. 2. A dielectric layer (tunnel oxide) 110 is deposited over a substrate 100. The dielectric layer 110 typically $SiO_2$, although in some embodiments it may be a high-k material. High k materials are generally forms of metallic oxides with k values greater than about 7, such as aluminum oxide ($Al_2O_3$), zirconium oxide ($ZrO_2$), hafnium oxide ($HfO_2$), tantalum oxide ($Ta_2O_5$), barium strontium titanate (BST), strontium bismuth tantalate (SBT), lanthanide oxides, and combinations thereof, such as $HfSiO_x$ and $HfZrO_x$. Although typically an oxide, the dielectric layer 110 may be another type of material.

A floating gate 120 is deposited directly over the dielectric layer. The floating gate 120 may comprise, for example, polysilicon. In some embodiments the floating gate 120 is replaced with a charge trap layer. In some embodiments the charge trap layer is silicon nitride, although other materials are possible.

A barrier oxide (or blocking dielectric) 130 is formed over the floating gate or charge trap layer 120. In some embodiments the barrier oxide 130 comprises $Al_2O_3$, although other materials such as $AlLaO_x$, $AlZrO_x$ and HfLaO can be used. The barrier oxide 130 may also be, for example, an ONO (oxide nitride oxide) structure comprising a bottom dielectric material adjacent to the floating gate or charge trap layer 120, a top dielectric material adjacent to the overlying control gate 140 and an intervening nitride layer located between the top and bottom dielectric material.

A control gate 140 is formed over the barrier oxide. Forming control gate 140 preferably comprises depositing a metal carbide gate electrode layer 150 by ALD using one or more aluminum hydrocarbon compounds, such that the metal carbide layer controls the work function of the control gate 140. In preferred embodiments the metal carbide is TaC. The metal carbide layer 150 is preferably deposited to a thickness of about 100 to 200 Å. The deposition conditions, for example temperature, pressure, pulse and purge times, plasma conditions (if used) and reactant choice are adjusted to achieve a desired amount of aluminum in the metal carbide layer 150 and thus produce the desired work function. In addition, the aluminum content is preferably such that the film is able to self-passivate during subsequent patterning and/or deposition steps.

In some embodiments the metal carbide layer serves as the entire control gate. In other embodiments, a second upper gate electrode layer 160 is deposited over and adjacent to the first lower gate electrode layer 150. The second gate electrode layer 160 comprises a conductive material, such as polysilicon, titanium nitride and/or a metal, such as tungsten. The upper gate electrode layer 160 may be thicker than the lower gate electrode layer 150. In some embodiments the upper gate electrode layer 160 has a thickness of about 1000 Å. Typically, the upper gate electrode layer 160 does not contribute to the work function of the control gate 140. However, in some embodiments the thickness of the lower gate electrode layer 150 and the upper gate electrode layer 160 are selected so that each contributes to the work function such that a desired work function is achieved.

Suitable materials for the dielectric layer 110, the floating gate or charge trap layer 120, the barrier oxide 130 and upper gate electrode layer 160 (if present) are known in the art and may be selected by the skilled artisan based on the particular circumstances. The dielectric layer 110 can be deposited by any deposition method know in the art, such as ALD or PEALD. The upper gate electrode layer 160 is preferably deposited by a chemical vapor deposition (CVD) type or physical vapor deposition (PVD) type process. In some embodiments the barrier oxide 130 and the control gate 150 are deposited on the same platform without any air break.

The structure is then patterned, etched and passivated, for example with silicon oxide. During the passivation process, the edges of the metal carbide layer are exposed and the aluminum in the metal carbide reacts with oxygen to self-passivate the remaining metal film.

Gate Electrodes

Figure 3:
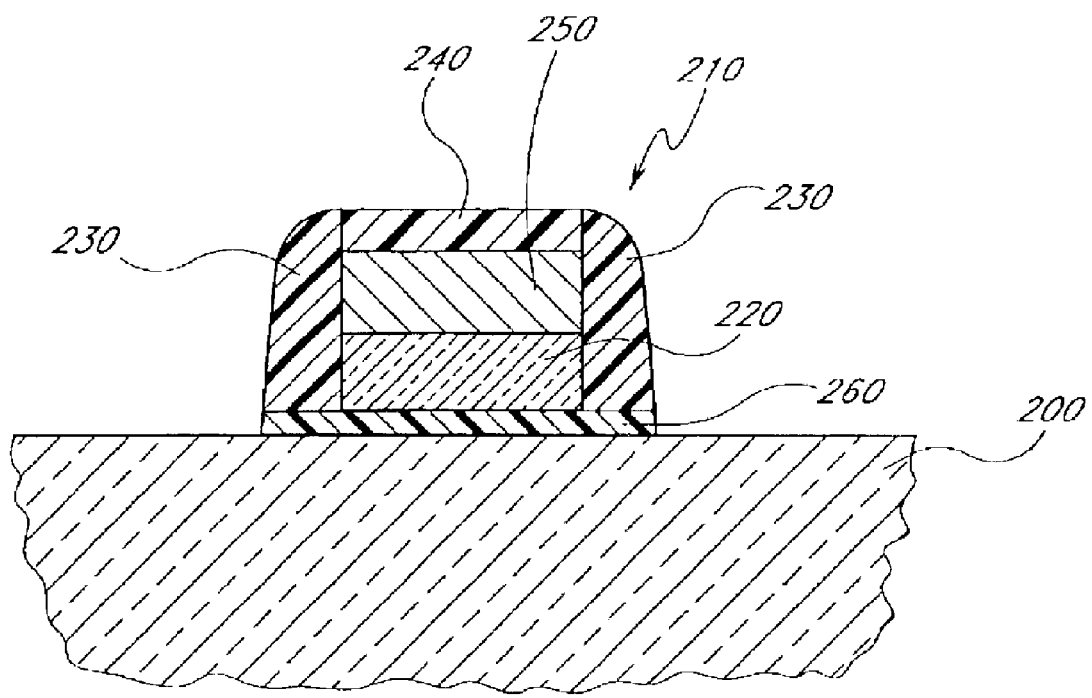
FIG. 3 is a schematic illustration of a gate electrode stack in a CMOS transistor.

In some embodiments transistor structures are provided in which a metal carbide film is deposited by ALD as described herein and forms at least a part of the gate electrode. A schematic illustration of a gate stack in a CMOS transistor is provided in FIG. 3. In particular, a semiconductor substrate 200 is shown with a transistor gate stack 210 formed thereover. In the illustrated embodiment, the substrate 200 comprises an upper portion of a single-crystal silicon wafer, though the skilled artisan will appreciate that the substrate can also comprise other semiconductor materials. The gate stack 210 includes a gate electrode layer 220 comprising metal carbide. Sidewall spacers 230 and an insulating layer 240 protect and isolate the electrode 220 in a conventional manner. Also illustrated is a more highly conductive strapping layer 250, typically including metal, over the silicon-containing gate electrode layer 220. The strap 250 facilitates rapid signal propagation among transistor gates across the wafer, connecting the gates to logic circuits. Note that integrated circuit transistors can have a variety of forms that do not all resemble that of FIG. 3. The gate electrode layer 220 of the preferred embodiments, however, will have application to gate electrodes in a variety of transistor types (e.g., heterojunction BiCMOS transistors).

At least a portion of the gate electrode 220 is formed by depositing a metal carbide layer by ALD using one or more aluminum hydrocarbon compounds. In some embodiments the metal carbide layer controls the work function of the gate electrode 220. In preferred embodiments the metal carbide comprises TaC. The metal carbide layer is preferably deposited to a thickness of about 20 to 200 Å. The deposition conditions, for example temperature, pressure, pulse and purge times, plasma conditions (if used) and reactant choice are adjusted to achieve a desired amount of aluminum in the metal carbide layer and thus produce the desired work function. In addition, the aluminum content is preferably such that the film is able to self-passivate during subsequent patterning and/or deposition steps.

In some embodiments the metal carbide layer serves as the entire gate electrode 220. In other embodiments, a second upper gate electrode layer is deposited over and adjacent to the metal carbide layer. The second upper gate electrode layer comprises a conductive material, such as polysilicon, titanium nitride and/or a metal, such as tungsten. The upper gate electrode layer may be thicker than the metal carbide gate electrode layer. In some embodiments the upper gate electrode layer has a thickness of about 1000 Å. Typically, the upper gate electrode layer does not contribute to the work function of the gate electrode. However, in some embodiments the thickness of the lower gate electrode layer and the upper gate electrode layer are selected so that each contributes to the work function such that a desired work function is achieved. The upper gate electrode layer is preferably deposited by a chemical vapor deposition (CVD) type or physical vapor deposition (PVD) type process.

EXAMPLES

Tantalum carbide films were deposited on silicon dioxide ($SiO_2$), $Al_2O_3$, SiN, $HfO_2$ and $Ta_2O_5$ substrates by ALD-type processes in both EmerALD and Pulsar reactors. The sequence of steps in the processes included alternately and sequentially pulsing a metal compound ($TaCl_5$), an aluminum hydrocarbon (TMA or TEA) and a purge gas (Ar) into a reaction space containing the substrate. Deposition was conducted under a variety of reaction conditions.

The sequence of gas pulses was as follows:
(1) $TaCl_5$ pulse;
(2) Ar purge;
(3) TMA or TEA pulse; and
(4) Ar purge.

Steps (1)-(4) were repeated to form tantalum carbide films.

Tantalum Carbide Deposition Using TMA

In one experiment, tantalum carbide films were deposited on silicon dioxide ($SiO_2$) from TMA and $TaCl_5$ at a reaction temperature of about 375° C. The sequence of gas pulses and purges (milliseconds, "ms") were as follows:
(1) $TaCl_5$ pulse (1000 ms);
(2) Ar purge (3000 ms);
(3) TMA pulse (1000 ms); and
(4) Ar purge (3000 ms).

Steps (1)-(4) were repeated to form a uniform tantalum carbide film with a deposition rate of approximately 3.5 Å/cycle.

Tantalum Carbide Deposition Using TEA

In another experiment, tantalum carbide films were deposited on silicon dioxide ($SiO_2$) from TEA and $TaCl_5$ at a reaction temperature of about 375° C. The sequence of gas pulses and purges (milliseconds, "ms") were as follows:
(1) $TaCl_5$ pulse (1000 ms);
(2) Ar purge (3000 ms);
(3) TEA pulse (2000 ms); and
(4) Ar purge (4000 ms).

Steps (1)-(4) were repeated to form a uniform tantalum carbide film with a deposition rate of approximately 4 Å/cycle.

TaC Film Properties

The resistivity of a 200 Å tantalum carbide film formed according to the procedure outlined in the examples above was about 1200 uohm*cm when TMA was used as the aluminum hydrocarbon and about 700 uohm*cm when TEA was used as the aluminum hydrocarbon reactant.

When deposited on an $Al_2O_3$ substrate, a TaC film deposited using TMA as the aluminum hydrocarbon compound delaminated from the substrate in scratch and tape tests. However, a TaC film deposited using TEA under otherwise identical conditions showed good adhesion using the same measures.

In at least some of the aforesaid embodiments, any element used in an embodiment can interchangeably be used in another embodiment unless such a replacement is not feasible.

It will be appreciated by those skilled in the art that various other omissions, additions and modifications may be made to the methods and structures described above without departing from the scope of the invention. All such modifications and changes are intended to fall within the scope of the invention, as defined by the appended claims.

We claim:

1. A thermal atomic layer deposition (ALD) process for forming a metal carbide thin film comprising Ti or Ta on a substrate in a reaction space, the process comprising alternately and sequentially contacting the substrate with vapor phase pulses of a metal halide and triethyl aluminum (TEA), wherein the metal halide is a tantalum halide or titanium halide, such that a metal carbide film comprising Ti or Ta and at least about 16% aluminum is formed.

2. The process of claim 1, wherein contacting the substrate with vapor phase pulses of a metal halide and TEA comprises:
providing the metal halide to the reaction space, thereby forming a metal layer over the substrate;
removing vapor phase metal halide from the reaction space;
providing vapor phase TEA to the reaction space, wherein TEA reacts with the metal layer to (a) deposit carbon in the metal layer and (b) form volatile reaction byproducts; and
removing the vapor phase TEA and the volatile reaction byproducts from the reaction space.

3. The process of claim 2, wherein the TEA provides carbon to the metal layer to form a metal carbide.

4. The process of claim 1, wherein the metal halide comprises Ti.

5. The process of claim 1, wherein the metal halide comprises Ta.

6. The process of claim 1, wherein the metal halide is selected from the group consisting of group consisting of $TaBr_w$, $TaCl_x$, and $TaI_z$, wherein w, x, y, and z are integers from 1 to 5.

7. The process of claim 1, wherein the metal halide comprises $TaCl_5$.

8. The process of claim 1, wherein the metal carbide film comprises about 30% aluminum.

9. The process of claim 1, wherein providing the TEA to the reaction space comprises a TEA pulse of up to about 20 seconds.

10. The process of claim 1, wherein providing the metal halide to the reaction space comprises a metal halide pulse of about 1 to 10 seconds.

11. The process of claim 1, wherein the substrate has a temperature of about 350° C. to 400° C.

12. The process of claim 1, wherein the metal carbide film is deposited to a thickness of about 1 to about 1000 Å.

13. The process of claim 1, wherein the metal carbide film is deposited to a thickness of about 100 to about 200 Å.

* * * * *

UNITED STATES PATENT AND TRADEMARK OFFICE
CERTIFICATE OF CORRECTION

Page 1 of 1

PATENT NO. : 9,631,272 B2
APPLICATION NO. : 14/069681
DATED : April 25, 2017
INVENTOR(S) : Dong Li et al.

It is certified that error appears in the above-identified patent and that said Letters Patent is hereby corrected as shown below:

On the Title Page

In Column 1 (page 4, item (56)) at Line 16, Under Other Publications, change "Depositied" to --Deposited--.

In Column 2 (page 4, item (56)) at Line 1, Under Other Publications, change "Soloutions" to --Solutions--.

In the Specification

In Column 1 at Line 30, Change "and" to --10 and--.

In the Claims

In Column 18 at Line 15 (approx.), In Claim 6, after "the" delete "group consisting of".

Signed and Sealed this
Eighth Day of August, 2017

Joseph Matal
*Performing the Functions and Duties of the*
*Under Secretary of Commerce for Intellectual Property and*
*Director of the United States Patent and Trademark Office*